US012787807B2

United States Patent

(12) United States Patent
Baek et al.

(10) Patent No.: US 12,787,807 B2
(45) Date of Patent: Nov. 3, 2026

(54) SEMICONDUCTOR PACKAGE

(71) Applicant: Samsung Electronics Co., Ltd., Suwon-si (KR)

(72) Inventors: Joonghyun Baek, Suwon-si (KR); Hyunsoo Chung, Suwon-si (KR); Seok-Hong Kwon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 552 days.

(21) Appl. No.: 18/239,846

(22) Filed: Aug. 30, 2023

(65) Prior Publication Data

US 2024/0234325 A1 Jul. 11, 2024

(30) Foreign Application Priority Data

Jan. 10, 2023 (KR) ........................ 10-2023-0003693

(51) Int. Cl.

| | |
|---|---|
| ***H10W 70/60*** | (2026.01) |
| ***H10W 42/00*** | (2026.01) |
| ***H10W 70/685*** | (2026.01) |
| ***H10W 90/00*** | (2026.01) |

(52) U.S. Cl.

CPC ........ *H10W 70/611* (2026.01); *H10W 42/121* (2026.01); *H10W 70/685* (2026.01); *H10W 90/00* (2026.01); *H10W 90/701* (2026.01); *H10W 90/724* (2026.01)

(58) Field of Classification Search

CPC ............. H10W 70/611; H10W 42/121; H10W 70/685; H10W 90/00; H10W 90/701; H10W 90/724; H10W 72/20; H10W 74/117; H10W 90/722; H10W 70/60; H10P 72/74; H10P 72/7424

See application file for complete search history.

(56) References Cited

U.S. PATENT DOCUMENTS

| | | | |
|---|---|---|---|
| 10,699,977 | B2 | 6/2020 | Chen et al. |
| 11,075,155 | B2 | 7/2021 | Chou et al. |
| 11,133,258 | B2 | 9/2021 | Yu et al. |
| 11,145,611 | B2 | 10/2021 | Kim et al. |
| 11,158,550 | B2 | 10/2021 | Oh |

(Continued)

FOREIGN PATENT DOCUMENTS

| | | | |
|---|---|---|---|
| KR | 20150085384 | A | 7/2015 |
| KR | 1020210146778 | A | 12/2021 |
| KR | 20220017022 | A | 2/2022 |

*Primary Examiner* — Eliseo Ramos Feliciano
*Assistant Examiner* — Thaddeus J Kolb
(74) *Attorney, Agent, or Firm* — Muir Patent Law, PLLC

(57) ABSTRACT

A semiconductor package includes a first redistribution layer, a first semiconductor chip, and a second semiconductor chip. The first redistribution layer includes a first intervening interconnection layer and a first upper interconnection layer. The first intervening interconnection layer includes a first intervening insulating layer, a first intervening redistribution pattern, and a stress buffer pattern, which is spaced apart from the first intervening redistribution pattern and is in an electrically floated state. The first upper interconnection layer includes a first upper insulating layer, a first upper redistribution pattern, and a first test pad on the first upper redistribution pattern. An area of the stress buffer pattern is larger than an area of the first test pad.

19 Claims, 11 Drawing Sheets

(56) References Cited

U.S. PATENT DOCUMENTS

| | | | | |
|---|---|---|---|---|
| 2013/0221493 | A1* | 8/2013 | Kim | H10P 72/74 257/774 |
| 2022/0071013 | A1* | 3/2022 | Morrison | H05K 1/181 |
| 2022/0077007 | A1 | 3/2022 | Kim et al. | |
| 2022/0199461 | A1 | 6/2022 | Yu et al. | |
| 2022/0359456 | A1* | 11/2022 | Chen | H10P 74/207 |
| 2023/0154869 | A1* | 5/2023 | Kim | H10P 54/00 257/620 |
| 2024/0063098 | A1* | 2/2024 | Liu | H10P 72/74 |
| 2024/0105626 | A1* | 3/2024 | Dabral | H10D 1/68 |
| 2024/0321704 | A1* | 9/2024 | Du | H10P 72/74 |
| 2026/0026392 | A1* | 1/2026 | Lu | H10B 80/00 |
| 2026/0136960 | A1* | 5/2026 | Tsai | H10W 70/614 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0003693, filed on Jan. 10, 2023, in the Korean Intellectual Property Office, the entire contents of which are hereby incorporated by reference.

BACKGROUND

The present disclosure relates to a semiconductor package, and in particular, to a semiconductor package including a redistribution substrate.

A semiconductor package is configured to easily use an integrated-circuit chip as a part of an electronic product. In general, the semiconductor package includes a printed circuit board (PCB) and a semiconductor chip, which is mounted on the PCB and is electrically connected to the PCB using bonding wires or bumps. With development of the electronic industry, various studies are being conducted to realize a highly-reliable, highly-integrated, and small-sized semiconductor package.

SUMMARY

An embodiment of the inventive concept provides a semiconductor package with improved reliability.

According to an embodiment of the inventive concept, a semiconductor package may include a first redistribution layer, a second redistribution layer under the first redistribution layer, a first semiconductor chip between the first redistribution layer and the second redistribution layer, and a second semiconductor chip between the first redistribution layer and the second redistribution layer. The first redistribution layer may include a first intervening interconnection layer and a first upper interconnection layer. The first intervening interconnection layer may include a first intervening insulating layer, a first intervening redistribution pattern, and a stress buffer pattern, which is spaced apart from the first intervening redistribution pattern and is in an electrically floated state. The first upper interconnection layer may include a first upper insulating layer, a first upper redistribution pattern, and a first test pad on the first upper redistribution pattern. An area of the stress buffer pattern may be larger than an area of the first test pad.

According to an embodiment of the inventive concept, a semiconductor package may include a first semiconductor chip, a second semiconductor chip spaced apart from the first semiconductor chip, a center connection post between the first semiconductor chip and the second semiconductor chip, a first connection post, a second connection post, and a first redistribution layer on the first semiconductor chip and the second semiconductor chip. The first redistribution layer may include a first intervening interconnection layer and a first upper interconnection layer on the first intervening interconnection layer. The first intervening interconnection layer may include a first intervening redistribution pattern, and a stress buffer pattern, which is spaced apart from the first intervening redistribution pattern and is in an electrically floated state. The first upper interconnection layer may include a first upper redistribution pattern, a first test pad overlapped with the first connection post when viewed in a plan view, and a second test pad overlapped with the second connection post when viewed in a plan view. The first connection post may include a first inner connection post, a first center connection post, and a first outer connection post, wherein the first inner connection post, the first center connection post, and the first outer connection post are separate from each other. The first outer connection post may be electrically connected to the first test pad. The second connection post may include a second inner connection post, a second center connection post, and a second outer connection post. The second outer connection post may be electrically connected to the second test pad.

According to an embodiment of the inventive concept, a semiconductor package may include a first redistribution layer, a second redistribution layer under the first redistribution layer, a first semiconductor chip between the first redistribution layer and the second redistribution layer, a second semiconductor chip between the first redistribution layer and the second redistribution layer, a first connection post spaced apart from the first semiconductor chip, wherein the first connection post connects the first redistribution layer to the second redistribution layer, and a center connection post between the first semiconductor chip and the second semiconductor chip. The first redistribution layer may include a first intervening interconnection layer and a first upper interconnection layer. The first intervening interconnection layer may include a first intervening insulating layer, a first intervening redistribution pattern, and a stress buffer pattern, which is spaced apart from the first intervening redistribution pattern and is in an electrically floated state. The first upper interconnection layer may include a first upper insulating layer, a first upper redistribution pattern, and a first test pad on the first upper redistribution pattern. An area of the stress buffer pattern may be larger than an area of the first test pad, and a Young's modulus of the first intervening insulating layer may be less than a Young's modulus of the first upper insulating layer.

DETAILED DESCRIPTION

Example embodiments of inventive concepts will now be described more fully with reference to the accompanying drawings, in which example embodiments are shown.

Figure 1:
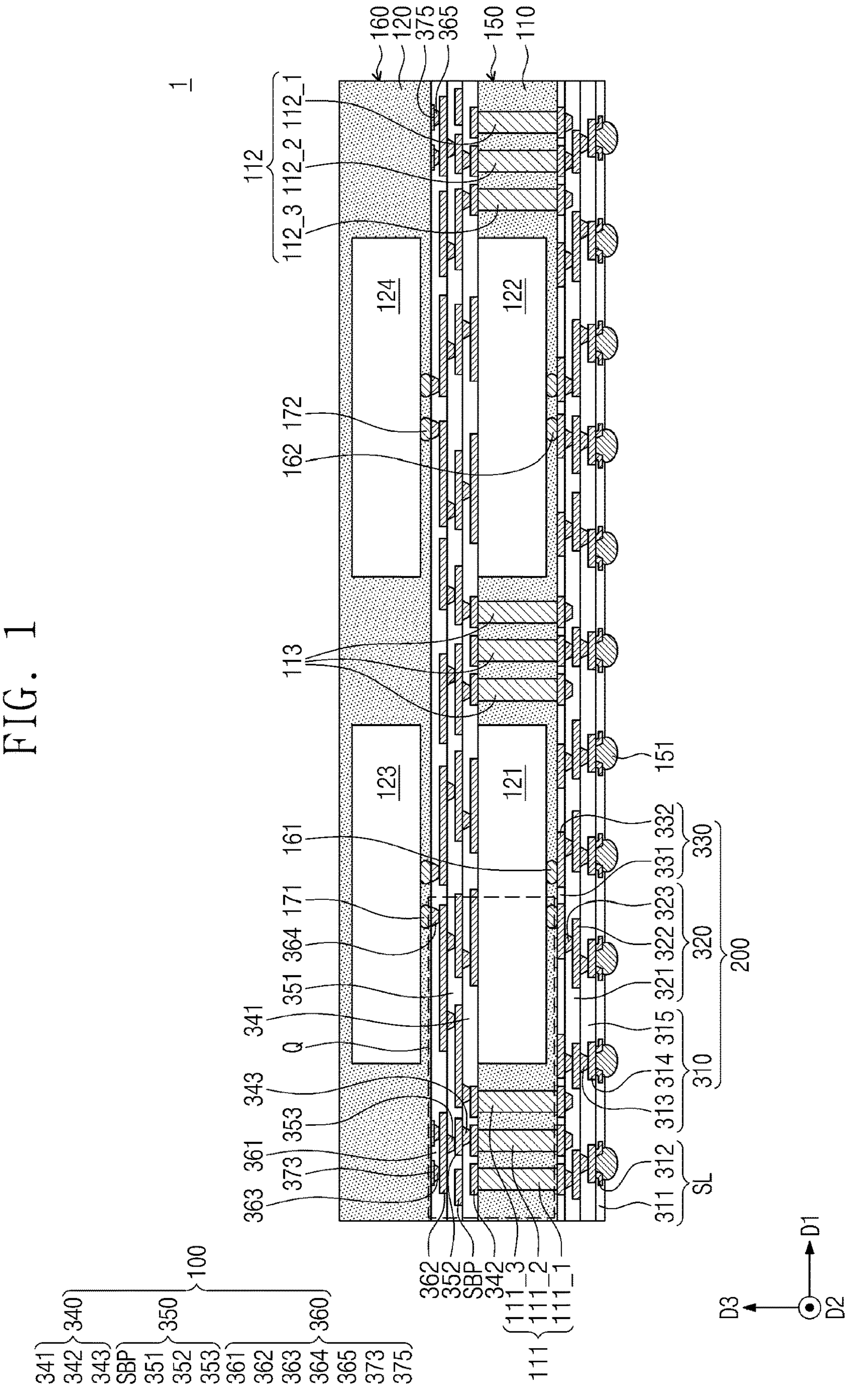
FIG. 1 is a sectional view illustrating a semiconductor package according to an embodiment of the inventive concept.
Figure 2:
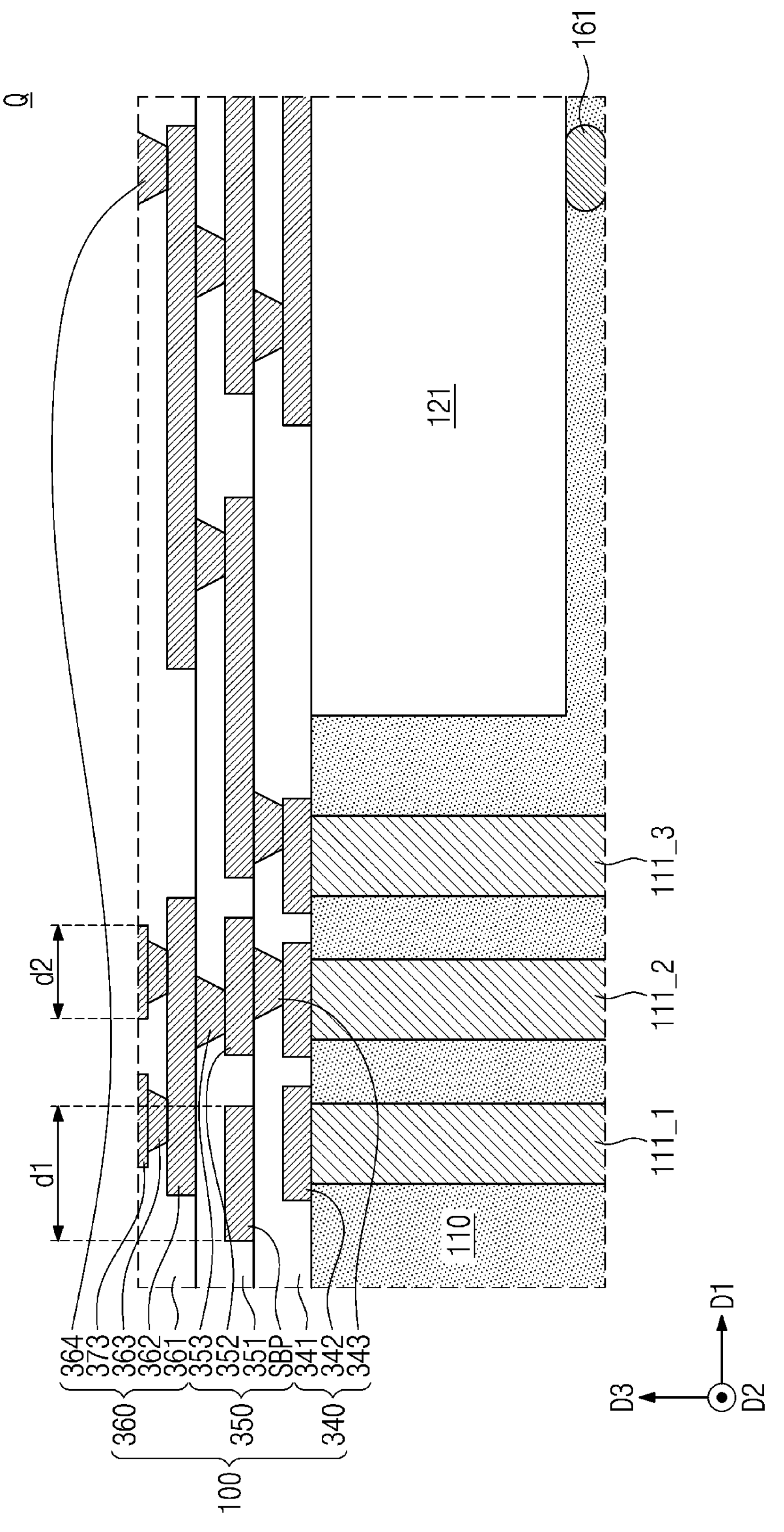
FIG. 2 is an enlarged sectional view illustrating a portion Q of FIG. 1 according to an embodiment of the inventive concept.

FIG. 1 is a sectional view illustrating a semiconductor package according to an embodiment of the inventive concept. FIG. 2 is an enlarged sectional view illustrating a portion Q of FIG. 1.

Referring to FIG. 1, a semiconductor package 1 may include a first redistribution layer 100, a solder layer SL, solder balls 151, a second redistribution layer 200, a first semiconductor structure 150 (e.g., a sub-package), and a second semiconductor structure 160 (e.g., a sub-package).

The solder balls 151 may be disposed below the solder layer SL. The solder balls 151 may be disposed below the second redistribution layer 200. The solder balls 151 may be electrically connected to the second redistribution layer 200. The solder balls 151 may be disposed on a bottom surface of the second redistribution layer 200. The solder balls 151 may be overlapped with the second redistribution layer 200 when viewed in a vertical direction. The solder balls 151 may include a conductive material. For example, the solder balls 151 may be formed of or include at least one of tin, bismuth, lead, silver, copper, or alloys thereof. The solder balls 151 may include signal solder balls, ground solder balls, and power solder balls.

The solder layer SL may be disposed on the solder balls 151. The solder layer SL may be a plate-shaped structure that extends parallel to a plane defined by a first direction D1 and a second direction D2. The first and second directions D1 and D2 may not be parallel to each other. As an example, the first and second directions D1 and D2 may be orthogonal to each other. For example, the first and second directions D1 and D2 may be horizontal directions and a third direction D3 may be a vertical direction that is orthogonal to the first and second directions D1 and D2. The solder layer SL may include a solder pad 312 and an insulating layer 311.

In an embodiment, the solder pad 312 may include a plurality of metal layers, which are used to improve a wetting property of a soldering material and to prevent diffusion of the soldering material. The solder pad 312 may be formed of or include at least one of, for example, titanium or copper. The solder ball 151 and the solder pad 312 may be electrically connected to each other. The semiconductor package 1 may be connected to an external terminal through the solder ball 151. In an embodiment, the solder pad 312 may be in contact with a bottom surface of a solder ball pad 314, which is included in the second redistribution layer 200 and which will be described below. A multi-layered metal structure (e.g., including titanium, copper, and so forth) may be formed at an interface between a lower portion of the solder ball pad 314 and the solder ball 151.

The insulating layer 311 may enclose the solder pad 312 and a portion of the solder ball 151. The insulating layer 311 may be formed of or include at least one of organic materials (e.g., a photoimageable dielectric (PID) material). The PID material may be a polymer. For example, the PID material may include at least one of photoimageable polyimide, polybenzoxazole, phenol-based polymers, or benzocyclobutene-based polymers.

The second redistribution layer 200 may be disposed on the solder layer SL. The second redistribution layer 200 may include a second lower interconnection layer 310, a second intervening interconnection layer 320 on the second lower interconnection layer 310, and a second upper interconnection layer 330 on the second intervening interconnection layer 320.

The second lower interconnection layer 310 may be disposed on the solder layer SL. The second lower interconnection layer 310 may include a second lower insulating layer 315, a solder ball pad 314, and a second lower redistribution via 313.

The second lower insulating layer 315 may enclose the solder ball pad 314 and the second lower redistribution via 313. The second lower insulating layer 315 may surround (with respect to a plan view) both of the solder ball pad 314 and the second lower redistribution via 313 while leaving upper and lower surfaces thereof exposed (with respect to the second lower insulating layer 315. The second lower insulating layer 315 may be formed of or include an organic material (e.g., the PID material). The second lower insulating layer 315 may include a material different from that of the insulating layer 311.

For the second lower redistribution via 313, a width of a top surface thereof may be larger than a width of a bottom surface thereof. The second lower redistribution via 313 may include a conductive material.

The solder ball pad 314 and the second lower redistribution via 313 may include a conductive material. The solder ball pad 314 and the second lower redistribution via 313 may be formed of or include, for example, copper.

The second intervening interconnection layer 320 may be disposed on the second lower interconnection layer 310. The second intervening interconnection layer 320 may include a second intervening insulating layer 321, a second intervening redistribution pattern 322, and a second intervening redistribution via 323.

The second intervening insulating layer 321 may enclose the second intervening redistribution pattern 322 and the second intervening redistribution via 323. The second intervening insulating layer 321 may surround (with respect to a plan view) both of the second intervening redistribution pattern 322 and the second intervening redistribution via 323 while leaving surfaces thereof exposed (with respect to the second intervening insulating layer 321). The second intervening insulating layer 321 may be formed of or include an organic material (e.g., the PID material). The second intervening insulating layer 321 may include a material different from that of the second lower insulating layer 315.

The second intervening redistribution pattern 322 may be disposed on the second lower interconnection layer 310. The second intervening redistribution pattern 322 may be disposed on the second lower redistribution via 313. The second intervening redistribution pattern 322 and the second lower redistribution via 313 may be electrically connected to each other.

For the second intervening redistribution via 323, a width of a top surface thereof may be larger than a width of a bottom surface thereof. The second intervening redistribution via 323 may include a conductive material.

The second intervening redistribution via 323 may be disposed on the second intervening redistribution pattern 322. A width of the second intervening redistribution via 323 may be smaller than a width of a top surface of the second intervening redistribution pattern 322.

The second intervening redistribution pattern 322 and the second intervening redistribution via 323 may be electrically connected to each other. There may be no observable or distinct interface between the second intervening redistribution pattern 322 and the second intervening redistribution via 323. The second intervening redistribution pattern 322 may be electrically connected to the solder ball pad 314.

The second upper interconnection layer 330 may be disposed on the second intervening interconnection layer 320. The second upper interconnection layer 330 may include a second upper insulating layer 331 and a second upper redistribution pattern 332.

The second upper insulating layer 331 may enclose the second upper redistribution pattern 332. In other words, the second upper insulating layer 331 may partially surround the second upper redistribution pattern 332 so as to leave a surface thereof exposed as shown, e.g., in FIG. 1. The second upper insulating layer 331 may be formed of or include an organic material (e.g., the PID material). The second upper insulating layer 331 may be formed of or include a material different from that of the second intervening insulating layer 321.

The second upper redistribution pattern 332 may be disposed on the second intervening redistribution via 323. A width of the second upper redistribution pattern 332 may be larger than a width of a top surface of the second intervening redistribution via 323.

The second intervening redistribution via 323 and the second upper redistribution pattern 332 may be electrically connected to each other. There may be no observable or distinct interface between the second intervening redistribution via 323 and the second upper redistribution pattern 332. The second intervening redistribution via 323 may be electrically connected to the second upper redistribution pattern 332.

The second upper redistribution pattern 332 may include a redistribution pad. Bumps 161 and 162, and connection posts 111, 112, and 113 may be provided on the second upper redistribution pattern 332, and a seed metal may be provided between the bumps 161 and 162 and the second upper redistribution pattern 332 and between the connection posts 111, 112, and 113 and the second upper redistribution pattern 332. The seed metal may include a material different from that of the second upper redistribution pattern 332.

The first semiconductor structure 150 may be disposed on the second redistribution layer 200. The first semiconductor structure 150 may include a first mold insulating layer 110, a first connection post 111, a first bump 161, a first semiconductor chip 121 on the first bump 161, a second bump 162, a second semiconductor chip 122 on the second bump 162, a center connection post 113 between the first and second semiconductor chips 121 and 122, and a second connection post 112 adjacent to the second semiconductor chip 122.

The first mold insulating layer 110 may be disposed on the second redistribution layer 200. The first mold insulating layer 110 may cover side surfaces of the first and second semiconductor chips 121 and 122 and side surfaces of the first, second, and center connection posts 111, 112, and 113. The first mold insulating layer 110 may be formed of or include an insulating polymer. The first mold insulating layer 110 may be further extended into a gap region between the second redistribution layer 200 and the first semiconductor chip 121 to seal the first bump 161. The gap region may be between a lower surface of the first semiconductor chip 121 and an upper surface of the second redistribution layer 200. The first mold insulating layer 110 may be further extended into a gap region between the second redistribution layer 200 and the second semiconductor chip 122 to seal the second bump 162.

The first connection posts 111 may include a first outer connection post 111_1, a first center connection post 111_2, and a first inner connection post 111_3. The first connection posts 111 may be laterally spaced apart from the first semiconductor chip 121. The gap region may be defined between a lower surface of the second semiconductor chip 122 and the upper surface of the second redistribution layer 200.

The first inner connection post 111_3 may be disposed closest to the first semiconductor chip 121 from among the first outer connection post 111_1, the first center connection post 111_2, and the first inner connection post 111_3. The first outer connection post 111_1 may be disposed farthest from the first semiconductor chip 121 among the first inner connection posts 111. The first center connection post 111_2 may be disposed between the first inner connection post 111_3 and the first outer connection post 111_1.

The first connection posts 111 may be disposed on, and coupled to, corresponding ones of the second upper redistribution patterns 332. Thus, the first connection posts 111 may be coupled to the second redistribution layer 200. The first connection posts 111 may be electrically connected to the solder balls 151 through the second redistribution layer 200.

The first connection posts 111 may be electrically connected to a first test pad 373 or a third semiconductor chip 123, which will be described below. In an embodiment, the first outer connection post 111_1 may be electrically connected to the first test pad 373, and the first center connection post 111_2 and the first inner connection post 111_3 may be electrically connected to the third semiconductor chip 123. However, the invention is not limited thereto, and any one of the first connection posts 111 may be connected to either one of the first test pad 373 and the third semiconductor chip 123 or to neither one of the first test pad 373 and the third semiconductor chip 123. The test pads described herein (such as the first test pad 373) may be connected to a test circuitry (not shown) of the package 1 (e.g., test circuitry forming part of an integrated circuit of one of the semiconductor chips of the package 1).

During testing, a tester may provide data and/or signals to the portions of the package 1 to be tested using the test circuitry (e.g., provide data and/or signals to various circuits of the semiconductor chips of the package 1 via the test pads and the test circuitry). All or part of the test circuitry may be dedicated to testing and thus not used after testing during normal operation of the package 1 (e.g., after the package 1 passes the tests and is assembled into a larger system). Similarly, all or some of the test pads may be dedicated to testing, and thus not used after testing during normal operation of the package 1. However, it is also possible that some test pads are not dedicated to testing and may also be used in the normal operation of the package 1. It will be appreciated that the test pads may act as terminals to the device being tested and allow probes of the tester to contact the same. For example, first test pads 373 and second test pads 375 (described below) may form terminals of the first semiconductor structure 150 and (prior to being assembled into package 1) allow tester probe contact in order to test the first semiconductor structure 150. Several such first semiconductor structures 150 may be tested in such a manner and only those passing such testing may be selected and used to form a corresponding semiconductor package (such as package 1).

The first connection posts 111 may be metal posts having the shape of a circular pillar. In an embodiment, the first connection posts 111 may have a diameter of 70 μm or larger. The first connection posts 111 may be formed of or include at least one of metallic materials (e.g., copper and tungsten).

The first bump 161 may be interposed between the second redistribution layer 200 and the first semiconductor chip 121. The first bump 161 may include a plurality of first bumps 161. The first semiconductor chip 121 may be electrically connected to the second redistribution layer 200 through the first bumps 161. The first bumps 161 may be electrically connected to an input/output pad, and a power pad, and a ground pad of the first semiconductor chip 121. The first bumps 161 may include a conductive material. For example, the first bumps 161 may be formed of or include at least one of metallic materials (e.g., aluminum, nickel, titanium, copper, and soldering materials).

The first semiconductor chip 121 may be disposed on the first bump 161. The first semiconductor chip 121 may include a memory chip. The first semiconductor chip 121 may include an input/output pad, a power pad, and a ground pad.

The second bump 162 may be interposed between the second redistribution layer 200 and the second semiconductor chip 122. The second bump 162 may include a plurality of second bumps 162. The second semiconductor chip 122 may be electrically connected to the second redistribution layer 200 through the second bumps 162. The second bumps 162 may include a conductive material. For example, the second bumps 162 may be formed of or include at least one of metallic materials.

The second semiconductor chip 122 may be disposed on the second bump 162. The second semiconductor chip 122 may include a memory chip.

The center connection post 113 may be disposed on the second redistribution layer 200. The center connection post 113 may be disposed between the first and second semiconductor chips 121 and 122. The center connection post 113 may include a plurality of center connection posts 113. The center connection posts 113 may be electrically connected to a third semiconductor chip 123 and/or a fourth semiconductor chip 124, which will be described below.

The second connection posts 112 may be disposed on the second redistribution layer 200. The second connection posts 112 may include a second outer connection post 112_1, a second center connection post 112_2, and a second inner connection post 112_3.

The second inner connection post 112_3 may be disposed closest to the second semiconductor chip 122 from among the second connection posts 112. The second outer connection post 112_1 may be disposed farthest from the second semiconductor chip 122 from among the second connection posts 112. The second center connection post 112_2 may be disposed between the second inner connection post 112_3 and the second outer connection post 112_1.

The second connection post 112 may be electrically connected to a second test pad 375 and/or a fourth semiconductor chip 124, which will be described below. In an embodiment, the second outer connection post 112_1 may be electrically connected to the second test pad 375, and the second center connection post 112_2 and the second inner connection post 112_3 may be electrically connected to the fourth semiconductor chip 124.

The first redistribution layer 100 may be disposed on the first semiconductor structure 150. The first redistribution layer 100 may include a first lower interconnection layer 340, a first intervening interconnection layer 350 on the first lower interconnection layer 340, and a first upper interconnection layer 360 on the first intervening interconnection layer 350. The first redistribution layer 100 may have a thickness between 10 μm and 60 μm.

The first lower interconnection layer 340 may include a first lower insulating layer 341, a first lower redistribution pattern 342, and a first lower redistribution via 343.

The first lower insulating layer 341 may enclose the first lower redistribution pattern 342 and the first lower redistribution via 343. In other words, the first lower insulating layer 341 may partially surround both of the first lower redistribution pattern 342 and the first lower redistribution via 343 so as to leave surfaces thereof exposed as shown, e.g., in FIG. 1. The first lower insulating layer 341 may be formed of or include an organic material (e.g., the PID material). For example, a Young's modulus of the first lower insulating layer 341 may be less than or equal to 5.0 GPa. In an embodiment, the Young's modulus of the first lower insulating layer 341 may be between 3.0 GPa and 5.0 GPa.

The first lower redistribution pattern 342 may include a redistribution pad. The first lower redistribution pattern 342 may be electrically connected to a corresponding one of the first connection post 111, the second connection post 112, the center connection post 113, the first semiconductor chip 121, or the second semiconductor chip 122.

The first lower redistribution via 343 may be disposed on the first lower redistribution pattern 342. For the first lower redistribution via 343, a width of a top surface thereof may be larger than a width of a bottom surface thereof. The first lower redistribution via 343 may be formed of or include a conductive material.

The first lower redistribution via 343 and the first lower redistribution pattern 342 may be electrically connected to each other.

The first intervening interconnection layer 350 may be disposed on the first lower interconnection layer 340. The first intervening interconnection layer 350 may include a first intervening insulating layer 351, a first intervening redistribution pattern 352, a first intervening redistribution via 353, and a stress buffer pattern SBP.

The first intervening insulating layer 351 may be provided to enclose the first intervening redistribution pattern 352, the stress buffer pattern SBP, and the first intervening redistribution via 353. In other words, the first intervening insulating layer 351 may partially surround all of the first intervening redistribution pattern 352, the stress buffer pattern SBP, and the first intervening redistribution via 353 so as to leave surfaces thereof exposed as shown, e.g., in FIG. 1. The first intervening insulating layer 351 may include an organic material (e.g., the PID material). The first intervening insulating layer 351 may include a material different from that of the first lower insulating layer 341. A Young's modulus of the first intervening insulating layer 351 may be smaller than or equal to a Young's modulus of the first lower insulating layer 341. For example, the Young's modulus of the first intervening insulating layer 351 may be less than 3.5 GPa.

The first intervening redistribution pattern 352 may be disposed on the first lower interconnection layer 340. The first intervening redistribution pattern 352 may be electrically connected to the first lower redistribution via 343. The first intervening redistribution pattern 352 may include a conductive material.

The stress buffer pattern SBP may be disposed on the first lower interconnection layer 340. The stress buffer pattern SBP may be in an electrically floated state. The stress buffer pattern SBP may be electrically disconnected from the first intervening redistribution pattern 352. All of top, bottom, and side surfaces of the stress buffer pattern SBP may be enclosed by an insulating material. For example, the entire top and side surfaces of the stress buffer pattern SBP may contact the first intervening insulating layer 351. For example, the entire bottom surface of the stress buffer pattern SBP may contact the first lower insulating layer 341. In an embodiment, the stress buffer pattern SBP may be spaced apart from the first intervening redistribution pattern 352. In an embodiment, the stress buffer pattern SBP may be provided or buried in the first intervening insulating layer 351. The stress buffer pattern SBP may be formed of or include a material having a hardness greater than that of the first intervening insulating layer 351. In an embodiment, the stress buffer pattern SBP may be formed of or include a metallic material. The stress buffer pattern SBP may be circular, when viewed in a plan view. In this case, a diameter d1 of the stress buffer pattern SBP may be larger than or equal to 200 μm. In an embodiment, the stress buffer pattern SBP may be overlapped with a first test via 363 when viewed in a plan view, which will be described below.

The first intervening redistribution via 353 may be disposed on the first intervening redistribution pattern 352. For the first intervening redistribution via 353, a width of a top surface may be larger than a width of a bottom surface. The first intervening redistribution via 353 and the first intervening redistribution pattern 352 may be electrically connected to each other. The first intervening redistribution via 353 may be electrically disconnected from the stress buffer pattern SBP.

The first upper interconnection layer 360 may be disposed on the first intervening interconnection layer 350. The first upper interconnection layer 360 may include a first upper insulating layer 361, a first upper redistribution pattern 362, a first test via 363, a first test pad 373, a first upper redistribution via 364, a second test via 365, and a second test pad 375.

The first upper insulating layer 361 may be provided to enclose the first upper redistribution pattern 362, the first test via 363, the first test pad 373, the first upper redistribution via 364, the second test via 365, and the second test pad 375. In other words, the first upper insulating layer 361 may partially surround all of the first upper redistribution pattern 362, the first test via 363, the first test pad 373, the first upper redistribution via 364, the second test via 365, and the second test pad 375 so as to leave surfaces thereof exposed as shown, e.g., in FIG. 1. The first upper insulating layer 361 may be formed of or include an organic material (e.g., the PID material). The first upper insulating layer 361 may include a material different from that of the first intervening insulating layer 351. The first upper insulating layer 361 may include a material different from that of the first lower insulating layer 341. A Young's modulus of the first intervening insulating layer 351 may be less than or equal to a Young's modulus of the first upper insulating layer 361. For example, the Young's modulus of the first upper insulating layer 361 may range from 3.5 GPa to 5.0 GPa.

The first upper redistribution pattern 362 may be disposed on the first intervening insulating layer 351. A width of the first upper redistribution pattern 362 may be larger than a width of a top surface of the first test via 363. The first upper redistribution pattern 362 may be formed of or include at least one of metallic materials. The first upper redistribution pattern 362 may include a metallic material different from that of the stress buffer pattern SBP.

The first upper redistribution via 364 may be disposed on the first upper redistribution pattern 362. For the first upper redistribution via 364, a width of a top surface thereof may be larger than a width of a bottom surface thereof. The first upper redistribution via 364 and the first upper redistribution pattern 362 may be electrically connected to each other. A bump pad 386 may be further disposed on the first upper redistribution via 364 (see, e.g., FIG. 3).

The first test via 363 may be disposed on the first upper redistribution pattern 362. The first test via 363 may include a plurality of first test vias 363. The first test via 363 may be overlapped with the first connection post 111 in a third direction D3.

The first test pad 373 may be disposed on the first test via 363. The first test pad 373 may be used to test the first semiconductor chip 121. For example, the first test pad 373 may be used to test whether or not the first semiconductor chip 121 is a failed chip.

The second test via 365 may be disposed on the first upper redistribution pattern 362. The second test via 365 may include a plurality of second test vias 365.

The second test pad 375 may be disposed on the second test via 365. The second test pad 375 may be used to test the second semiconductor chip 122. For example, the second test pad 375 may be used to test whether or not the second semiconductor chip 122 is a failed chip.

An area of one or both of the first and second test pads 373 and 375 may be smaller than an area of the stress buffer pattern SBP. For example, a planar area of the first or second test pad 373 or 375 defined in the first and second directions D1 and D2 may be smaller than a planar area of the stress buffer pattern SBP defined in the first and second directions D1 and D2. One or both of the first and second test pads 373 and 375 may have a tetragonal shape (e.g., rectangle or square), when viewed in a plan view. In this case, one side (e.g., a long side) of the first or second test pad 373 or 375 may have a length d2 of 100 μm or less (see, e.g., FIG. 2). The entire top surfaces of the first and second test pads 373 and 375 may be in contact with a second mold insulating layer 120, which will be described below.

The second semiconductor structure 160 may be provided on the first redistribution layer 100. The second semiconductor structure 160 may include a second mold insulating layer 120, a third bump 171, a third semiconductor chip 123 on the third bump 171, a fourth bump 172, and a fourth semiconductor chip 124 on the fourth bump 172.

The second mold insulating layer 120 may be disposed on the first redistribution layer 100. The second mold insulating layer 120 may cover side surfaces of the third and fourth semiconductor chips 123 and 124. The second mold insulating layer 120 may be formed of or include an insulating polymer. The second mold insulating layer 120 may be further extended into a gap region between the first redistribution layer 100 and the third semiconductor chip 123 to seal the third bump 171. The second mold insulating layer 120 may be further extended into a gap region between the first redistribution layer 100 and the fourth semiconductor chip 124 to seal the fourth bump 172.

The third bump 171 may be interposed between the first redistribution layer 100 and the third semiconductor chip 123. The third bump 171 may include a plurality of third bumps 171. The third semiconductor chip 123 may be electrically connected to the first redistribution layer 100 through the third bumps 171. The third bumps 171 may be electrically connected to an input/output pad, a power pad, and a ground pad of the third semiconductor chip 123. The third bumps 171 may include a conductive material. For example, the third bumps 171 may be formed of or include at least one of metallic materials.

The third semiconductor chip 123 may be disposed on the third bump 171. The third semiconductor chip 123 may include a memory chip. Although not shown, the third semiconductor chip 123 may include an input/output pad, a power pad, and a ground pad.

The fourth bump 172 may be interposed between the first redistribution layer 100 and the fourth semiconductor chip 124. The fourth bump 172 may include a plurality of the fourth bumps 172. The fourth semiconductor chip 124 may be electrically connected to the first redistribution layer 100 through the fourth bumps 172. The fourth bumps 172 may be electrically connected to input/output pads, a power pad, and a ground pad of the fourth semiconductor chip 124. The fourth bumps 172 may include a conductive material. For example, the fourth bumps 172 may be formed of or include at least one of metallic materials (e.g., aluminum, nickel, titanium, copper, and soldering materials).

The fourth semiconductor chip 124 may be disposed on the fourth bump 172. The fourth semiconductor chip 124 may include a memory chip.

The third semiconductor chip 123 may be electrically connected to the solder ball 151 through the third bump 171, the first upper redistribution via 364, the first upper redistribution pattern 362, the first intervening redistribution via 353, the first intervening redistribution pattern 352, the first lower redistribution via 343, the first lower redistribution pattern 342, the first connection post 111, the center connection post 113, and the second redistribution layer 200.

The fourth semiconductor chip 124 may be electrically connected to the solder ball 151 through the fourth bump 172, the first upper redistribution via 364, the first upper redistribution pattern 362, the first intervening redistribution via 353, the first intervening redistribution pattern 352, the first lower redistribution via 343, the first lower redistribution pattern 342, the second connection post 112, the center connection post 113, and the second redistribution layer 200.

Figure 3:
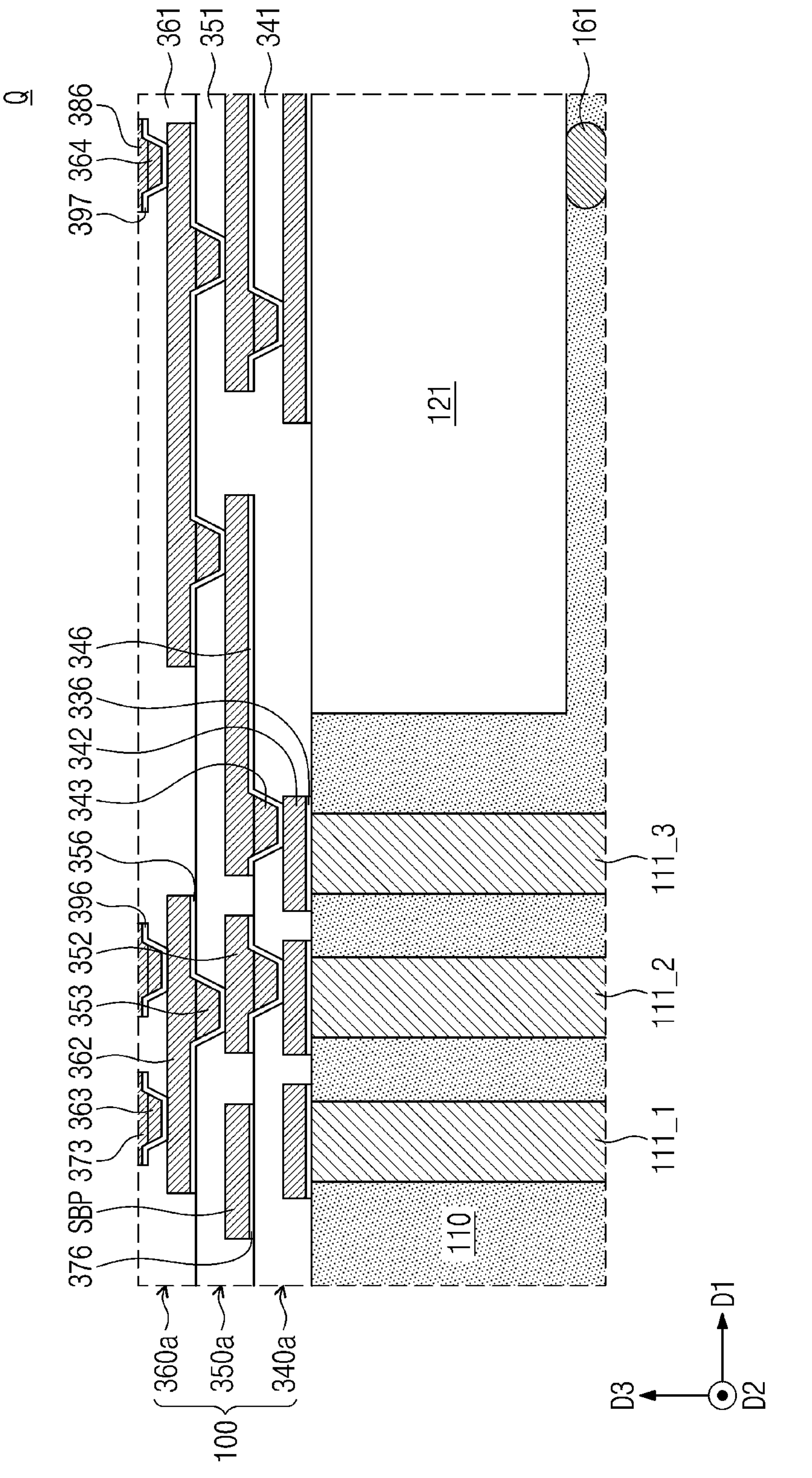
FIG. 3 is an enlarged sectional view illustrating a portion Q of FIG. 1 according to an embodiment of the inventive concept.

FIG. 3 is a sectional view illustrating a semiconductor package according to an embodiment of the inventive concept.

FIG. 3 is a sectional view corresponding to a portion 'Q' of FIG. 1. Referring to FIG. 3, a bump pad 386, a first seed pattern 346, a second seed pattern 356, a third seed pattern 376, a fourth seed pattern 336, a fifth seed pattern 396, and a sixth seed pattern 397 may be further provided.

The bump pad 386 may be provided on the first upper redistribution via 364. The bump pad 386 may be interposed between the first upper redistribution via 364 and the third bump 171.

The first seed pattern 346 may be provided along a bottom surface of the first intervening redistribution pattern 352 and a bottom surface of the first lower redistribution via 343. The first seed pattern 346 may be interposed between the first lower redistribution via 343 and the first lower redistribution pattern 342 and between the bottom surface of the first intervening redistribution pattern 352 and the first lower insulating layer 341. The first seed pattern 346 may be formed of or include a material that is different from that of the first intervening redistribution pattern 352 and the first lower redistribution via 343. For example, the first seed pattern 346 may include a conductive seed material. The first seed pattern 346 may serve as a barrier layer preventing undesired diffusion of a material, which is included in the first intervening redistribution pattern 352 and the first lower redistribution via 343.

The second seed pattern 356 may be provided along a bottom surface of the first upper redistribution pattern 362 and a bottom surface of the first intervening redistribution via 353. The second seed pattern 356 may be interposed between the first intervening redistribution via 353 and the first intervening redistribution pattern 352 and between the bottom surface of the first upper redistribution pattern 362 and the first intervening insulating layer 351.

The third seed pattern 376 may be provided along the bottom surface of the stress buffer pattern SBP. The third seed pattern 376 may be interposed between the bottom surface of the stress buffer pattern SBP and the first lower insulating layer 341. The third seed pattern 376 may be formed of or include a material that is different from that of the first lower insulating layer 341 and the stress buffer pattern SBP. For example, the third seed pattern 376 may include a conductive seed material. The third seed pattern 376 may serve as a barrier layer preventing undesired diffusion of a material, which is included in the stress buffer pattern SBP and the first lower insulating layer 341.

The fourth seed pattern 336 may be provided along a bottom surface of the first lower redistribution pattern 342. The fourth seed pattern 336 may be interposed between the first lower redistribution pattern 342 and the first inner connection post 111_3. The fourth seed pattern 336 may be formed of or include a material that is different from that of the first lower redistribution pattern 342. For example, the fourth seed pattern 336 may include a conductive seed material. The fourth seed pattern 336 may serve as a barrier layer preventing undesired diffusion of a material, which is included in the first lower redistribution pattern 342 and the first inner connection post 111_3.

The fifth seed pattern 396 may be provided along a bottom surface of the first test via 363 and a bottom surface of the first test pad 373. The fifth seed pattern 396 may be interposed between the first test via 363 and the first upper redistribution pattern 362. The fifth seed pattern 396 may be formed of or include a material that is different from that of the first test via 363. For example, the fifth seed pattern 396 may include a conductive seed material. The fifth seed pattern 396 may serve as a barrier layer preventing undesired diffusion of a material, which is included in the first test via 363 and the first upper redistribution pattern 362.

The sixth seed pattern 397 may be provided along a bottom surface of the first upper redistribution via 364. The sixth seed pattern 397 may be interposed between the first upper redistribution via 364 and the first upper redistribution patter 362. The sixth seed pattern 397 may be formed of or include a material that is different from that of the first upper redistribution via 364. For example, the sixth seed pattern 397 may include a conductive seed material. The sixth seed pattern 397 may serve as a barrier layer preventing undesired diffusion of a material, which is included in the first upper redistribution via 364 and the third bump 171.

A seed layer may be provided between the first upper redistribution pattern 362 and the third bump 171. The seed layer may be composed of an under bump metallurgy (UBM) and may be formed of or include a material different from that of the first seed pattern 346, the second seed pattern 356, the third seed pattern 376, the fourth seed pattern 336, the fifth seed pattern 396, and the sixth seed pattern 397.

In an embodiment, patterns, which are similar to the first seed pattern 346, the second seed pattern 356, the third seed pattern 376, the fourth seed pattern 336, the fifth seed pattern 396, and the sixth seed pattern 397, may be provided in a redistribution layer corresponding to the second redistribution layer 200.

Figure 4A:
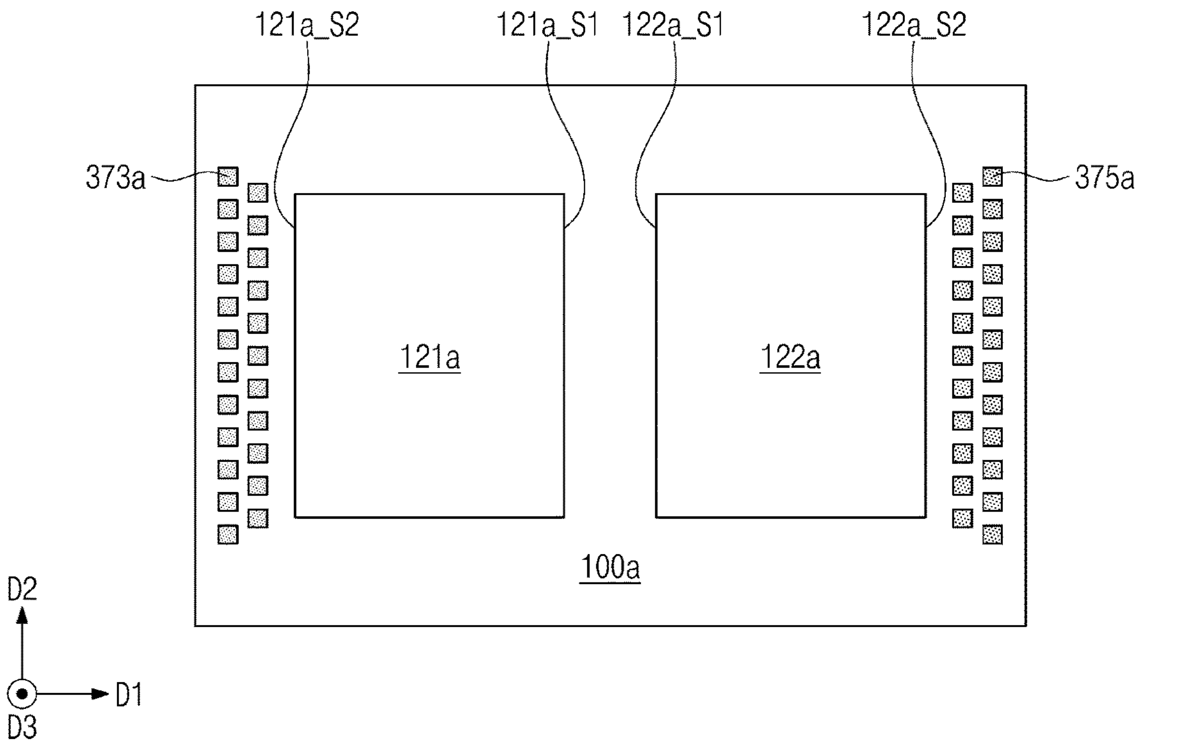
FIGS. 4A and 4B are plan views illustrating a semiconductor package according to an embodiment of the inventive concept.

FIG. 4A is a plan view illustrating a semiconductor package according to an embodiment of the inventive concept.

Referring to FIG. 4A, the semiconductor package may include a first redistribution layer 100*a* with a first test pad 373*a* and a second test pad 375*a*. The first test pad 373*a* may be disposed adjacent to the first semiconductor chip 121*a*, and the second test pad 375*a* may be disposed adjacent to the second semiconductor chip 122*a*. The first test pad 373*a* may include a plurality of first test pads 373*a*. In an embodiment, the first semiconductor chip 121*a* may include a first surface 121*a*_S1 facing the second semiconductor chip 122*a* and a second surface 121*a*_S2 opposite to the first surface 121*a*_S1, and the first test pads 373*a* may be disposed adjacent to the second surface 121*a*_S2 of the first semiconductor chip 121*a*. The first test pads 373*a* may be disposed in a line along the second surface 121*a*_S2 of the first semiconductor chip 121*a*.

In an embodiment, the second semiconductor chip 122*a* may include a first surface 122*a*_S1 facing the first semiconductor chip 121*a* and a second surface 122*a*_S2 opposite to the first surface 122*a*_S1, and the second test pads 375*a* may be disposed adjacent to the second surface 122*a*_S2 of the second semiconductor chip 122*a*. The second test pads 375*a* may be disposed in a line along the second surface 122*a*_S2 of the second semiconductor chip 122*a*

Figure 4B:
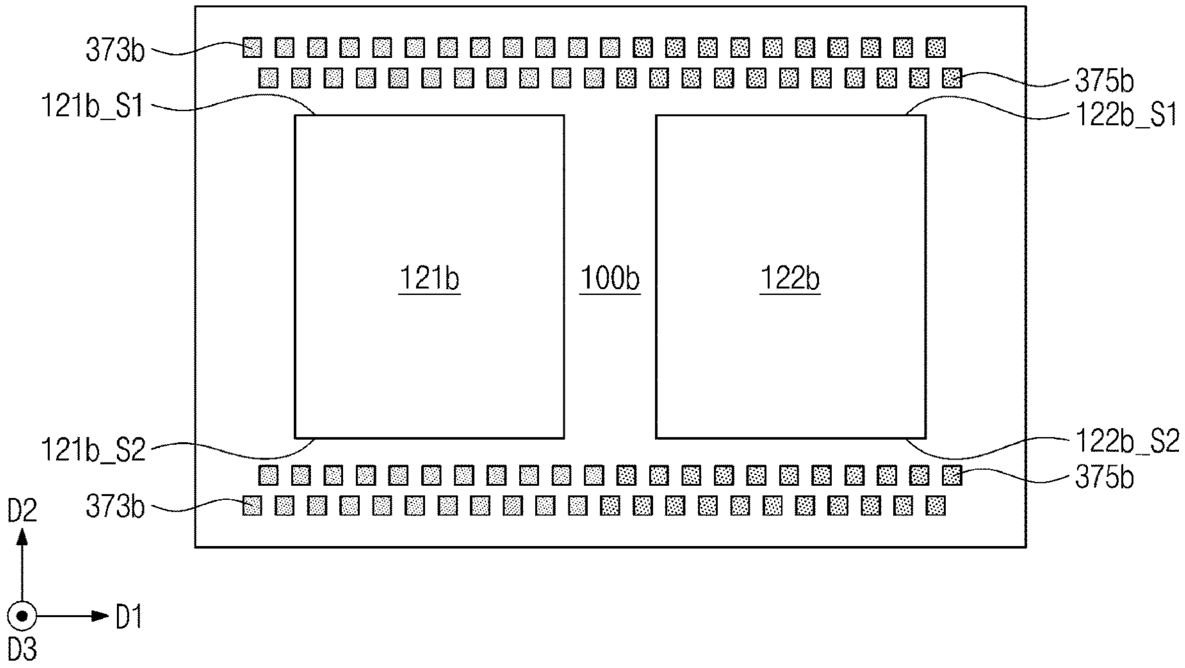

FIG. 4B is a plan view illustrating a semiconductor package according to an embodiment of the inventive concept.

Referring to FIG. 4B, the semiconductor package may include a first redistribution layer 100*b* with a first test pad 373*b* and a second test pad 375*b*. The first test pad 373*b* may be disposed adjacent to a first semiconductor chip 121*b*, and the second test pad 375*b* may be disposed adjacent to a second semiconductor chip 122*b*. The first test pad 373*b* may include a plurality of first test pads 373*b*. In an embodiment, the first test pads 373*b* and the second test pads 375*b* may be arranged to form a line parallel to the first direction D1. The first test pads 373*b* may be overlapped with the first semiconductor chip 121*b*, and the second test pads 375*b* may be overlapped with the second semiconductor chip 122*b*.

In an embodiment, the first semiconductor chip 121*b* may include a first surface 121*b*_S1 and a second surface 121*b*_S2, which are opposite to each other. The first test pads 373*b* may be disposed adjacent to the first and second surfaces 121*b*_S1 and 121*b*_S2 of the first semiconductor chip 121*b*. The first test pads 373*b* may be arranged in the first direction D1 and may be arranged adjacent to the first and second surfaces 121*b*_S1 and 121*b*_S2 of the first semiconductor chip.

In an embodiment, the second semiconductor chip 122*b* may include a first surface 122*b*_S1 and a second surface 122*b* S2, which are opposite to each other. The second test pads 375*b* may be disposed adjacent to the first and second surfaces 122*b*_S1 and 122*b* S2 of the second semiconductor chip 122*b*. The second test pads 375*b* may be arranged adjacent to the first and second surfaces 122*b*_S1 and 122*b*_S2 of the second semiconductor chip 122*b* and in the first direction D1.

Referring to FIGS. 4A and 4B, the first test pads 373*a* and 373*b* may be used to test the first semiconductor chips 121*a* and 121*b*, respectively, and the second test pads 375*a* and 375*b* may be used to test the second semiconductor chips 122*a* and 122*b*, respectively.

Figure 5:
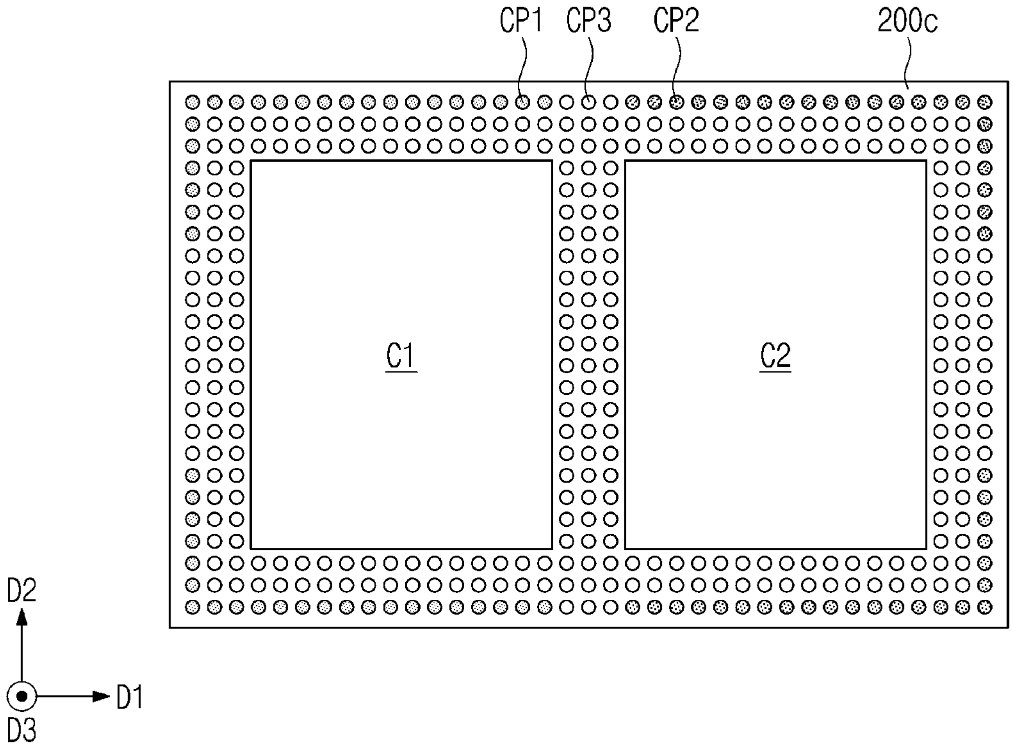
FIG. 5 is a plan view illustrating a semiconductor package according to an embodiment of the inventive concept.

FIG. 5 is a plan view illustrating a semiconductor package according to an embodiment of the inventive concept.

FIG. 5 is a plan view of an example of the first semiconductor structure 150 of FIG. 1. Referring to FIG. 5, a first semiconductor chip C1, a second semiconductor chip C2, a first connection post CP1, a second connection post CP2, and a center connection post CP3 may be disposed on a second redistribution layer 200*c*.

The first semiconductor chip C1 and the second semiconductor chip C2 may be spaced apart from each other in the first direction D1. Each of the first and second semiconductor chips C1 and C2 may be a memory chip or a logic chip.

The center connection post CP3 may be disposed closest to the first and second semiconductor chips C1 and C2. The center connection post CP3 may be electrically connected to third and fourth semiconductor chips as shown in FIG. 1, which may be disposed on the first and second semiconductor chips C1 and C2. In an embodiment, a plurality of center connection posts CP3 may be provided to form at least one closed loop enclosing the first and second semiconductor chips C1 and C2. In other words, one or more rings of center connection posts CP3 may encircle each of the first and second semiconductor chips C1 and C2.

The first connection post CP1 may be electrically connected to the afore-described first test pad 373. A distance between at least one of the first connection posts CP1 and the first semiconductor chip C1 may be larger than a distance between at least one of the center connection posts CP3 and the first semiconductor chip C1. In an embodiment, the center connection posts CP3 and the first connection post CP1 may be sequentially arranged in the second direction D2 from the first semiconductor chip C1.

The second connection post CP2 may be electrically connected to the afore-described second test pad 375. A distance between at least one of the second connection posts CP2 and the second semiconductor chip C2 may be larger than a distance between at least one of the center connection posts CP3 and the second semiconductor chip C2. In an embodiment, the center connection posts CP3 and the second connection post CP2 may be sequentially arranged in the second direction D2 from the second semiconductor chip C2.

Figure 6A:
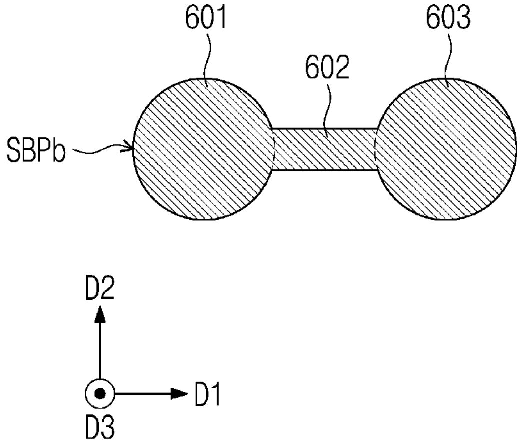
FIGS. 6A and 6B are diagrams, each of which illustrates a stress buffer pattern according to an embodiment of the inventive concept.
Figure 6B:
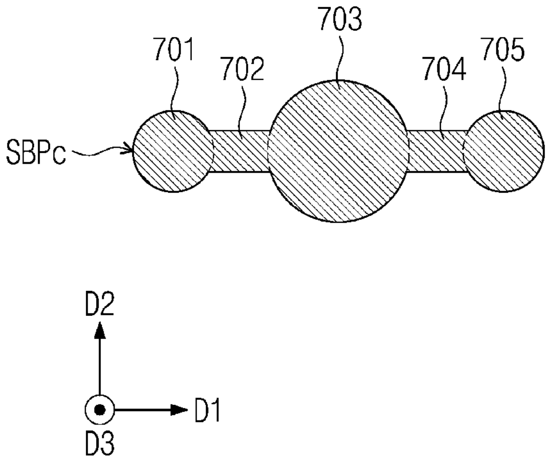

FIGS. 6A and 6B are diagrams, each of which illustrates a stress buffer pattern according to an embodiment of the inventive concept.

Referring to FIG. 6A, a stress buffer pattern SBPb according to an embodiment of the inventive concept may have a dumbbell shape. In this case, the stress buffer pattern SBPb may include a first dumbbell portion 601, a second dumbbell portion 602, and a third dumbbell portion 603. The first dumbbell portion 601, the second dumbbell portion 602, and the third dumbbell portion 603 may be connected to form a single object without any interface.

The first and third dumbbell portions 601 and 603 may have a circular shape. The first and third dumbbell portions 601 and 603 may be provided to have the same diameter. However, in an embodiment, the first and third dumbbell portions 601 and 603 may be provided to have diameters different from each other.

The second dumbbell portion 602 may be provided between the first and third dumbbell portions 601 and 603. The second dumbbell portion 602 may electrically connect the first dumbbell portion 601 to the third dumbbell portion 603.

The largest width of the first dumbbell portion 601 in the second direction D2 and the largest width of the third dumbbell portion 603 in the second direction D2 may be larger than the width of the second dumbbell portion 602 in the second direction D2.

Referring to FIG. 6B, a stress buffer pattern SBPc according to an embodiment of the inventive concept may be composed of circular pattern portions 701, 703, and 705, which are connected to each other and have different sizes from each other. The circular pattern portions 701, 703, and 705 may be electrically connected to each other through connecting portions 702 and 704. The stress buffer pattern SBPc may include a first circular pattern portion 701, a first connecting portion 702, a second circular pattern portion 703, a second connecting portion 704, and a third circular pattern portion 705. An area of the first circular pattern portion 701 may be smaller than an area of the second circular pattern portion 703. An area of the third circular pattern portion 705 may be smaller than the area of the second circular pattern portion 703. The first connecting portion 702 may be disposed between the first circular pattern portion 701 and the second circular pattern portion 703 and may connect the first circular pattern portion 701 to the second circular pattern portion 703. The second connecting portion 704 may be disposed between the second circular pattern portion 703 and the third circular pattern portion 705 and may connect the second circular pattern portion 703 to the third circular pattern portion 705. The first circular pattern portion 701, the first connecting portion 702, the second circular pattern portion 703, the second connecting portion 704, and the third circular pattern portion 705 may be connected to form a single object without any interface. The largest width of the first circular pattern portion 701 in the second direction D2 and the largest width of the third circular pattern portion 705 in the second direction D2 may be smaller than a largest width of the second circular pattern portion 703 in the second direction D2. The largest width of the circular pattern portions 701, 703, and 705 in the second direction D2 may be larger than the largest width of the connecting portions 702 and 704 in the second direction D2.

Figure 7:
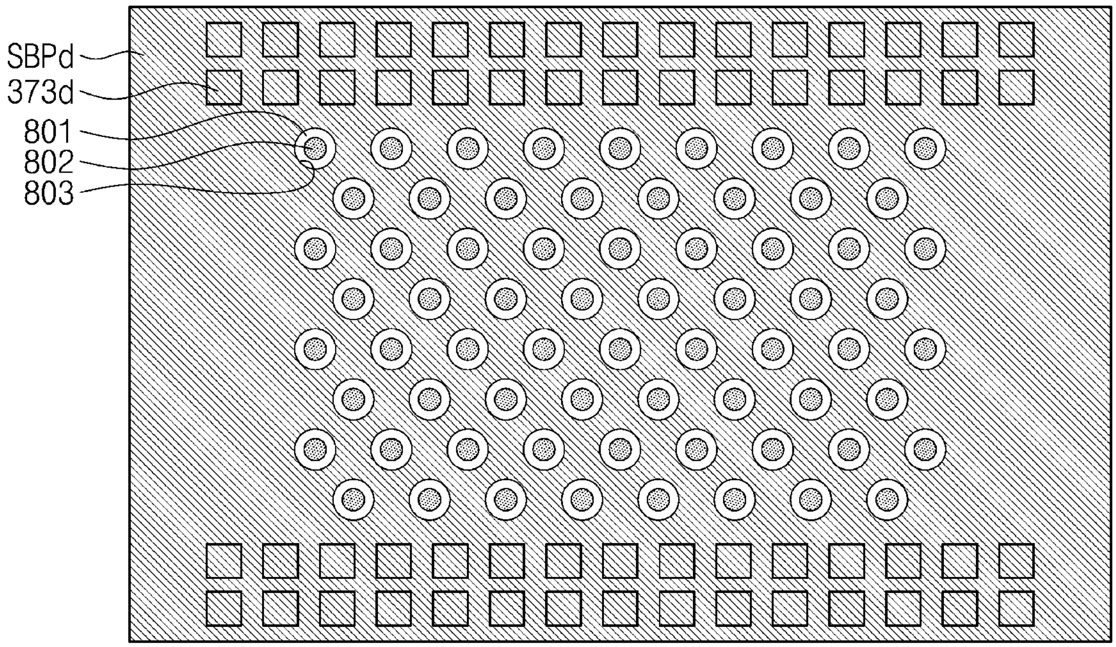
FIG. 7 is a plan view illustrating a stress buffer pattern according to an embodiment of the inventive concept.

FIG. 7 is a plan view illustrating a stress buffer pattern according to an embodiment of the inventive concept.

Referring to FIG. 7, a stress buffer pattern SBPd may be a stress buffer layer SBPd with buffer via holes 803. The stress buffer layer SBPd may be a plate-shaped structure, which is additionally disposed on the first intervening interconnection layer 350 described above and is extended in the first and second directions D1 and D2. The stress buffer pattern SBPd may be provided between the first intervening interconnection layer 350 and the first upper interconnection layer 360. The stress buffer layer SBPd may be overlapped with a first test pad **373*d*** in the third direction D3.

The buffer via hole 803 of the stress buffer layer SBPd may be filled with a buffer via 802 and a buffer insulating layer 801. The buffer via 802 may include a plurality of buffer vias 802. The buffer insulating layer 801 may be interposed between the buffer via 802 and the stress buffer layer SBPd, and thus, the buffer via 802 and the stress buffer layer SBPd may be electrically disconnected from each other. A redistribution pattern corresponding to the afore-described first upper redistribution pattern 362 may be electrically connected to a via corresponding to the first intervening redistribution via 353 through the buffer via 802.

The first test pads **373*d* may be arranged in the first direction D1. As shown in FIG. 7, the buffer vias 802 may be interposed between the first test pads 373*d*. In an embodiment, one or more first test pads 373*d* may be arranged in the first direction D1. However, the arrangement of the first test pads 373*d*** is not limited to this example.

FIGS. 8, 9, 10, and 11 are sectional views illustrating a method of fabricating a semiconductor package, according to an embodiment of the inventive concept.

Figure 8:
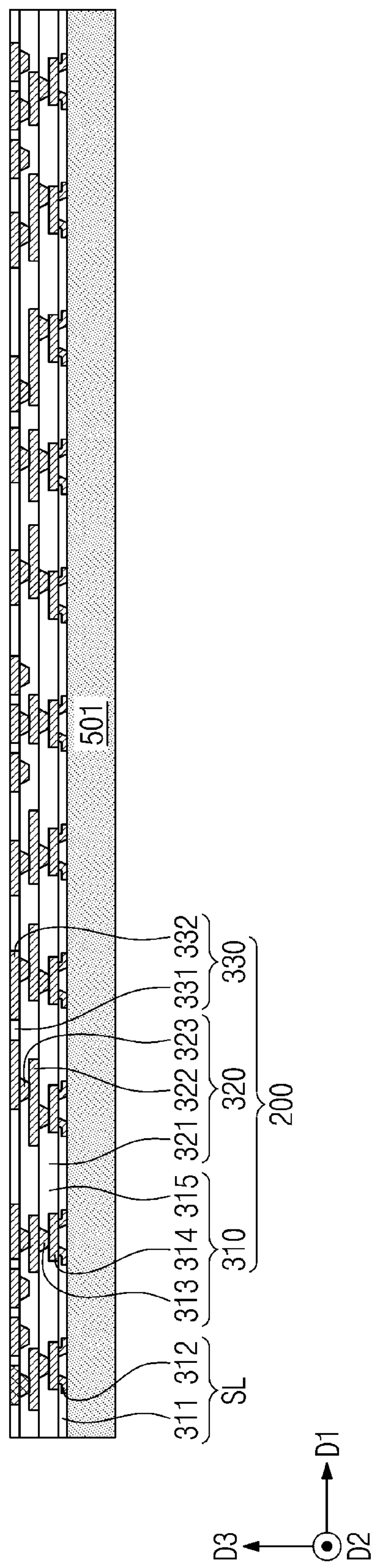
FIGS. 8, 9, 10, and 11 are sectional views illustrating a method of fabricating a semiconductor package, according to an embodiment of the inventive concept.

Referring to FIG. 8, the solder layer SL and the second redistribution layer 200 may be formed on a carrier substrate 501. The formation of the second redistribution layer 200 may include sequentially forming the second lower interconnection layer 310, the second intervening interconnection layer 320, and the second upper interconnection layer 330 on the solder layer SL.

The solder pad 312 of the solder layer SL may be formed. The solder ball pad 314 and the second lower redistribution via 313 of the second lower interconnection layer 310 may be formed. The second intervening redistribution pattern 322 and the second intervening redistribution via 323 of the second intervening interconnection layer 320 may be formed by an electroplating process. The second upper redistribution pattern 332 of the second upper interconnection layer 330 may be formed by an electroplating process.

Figure 9:
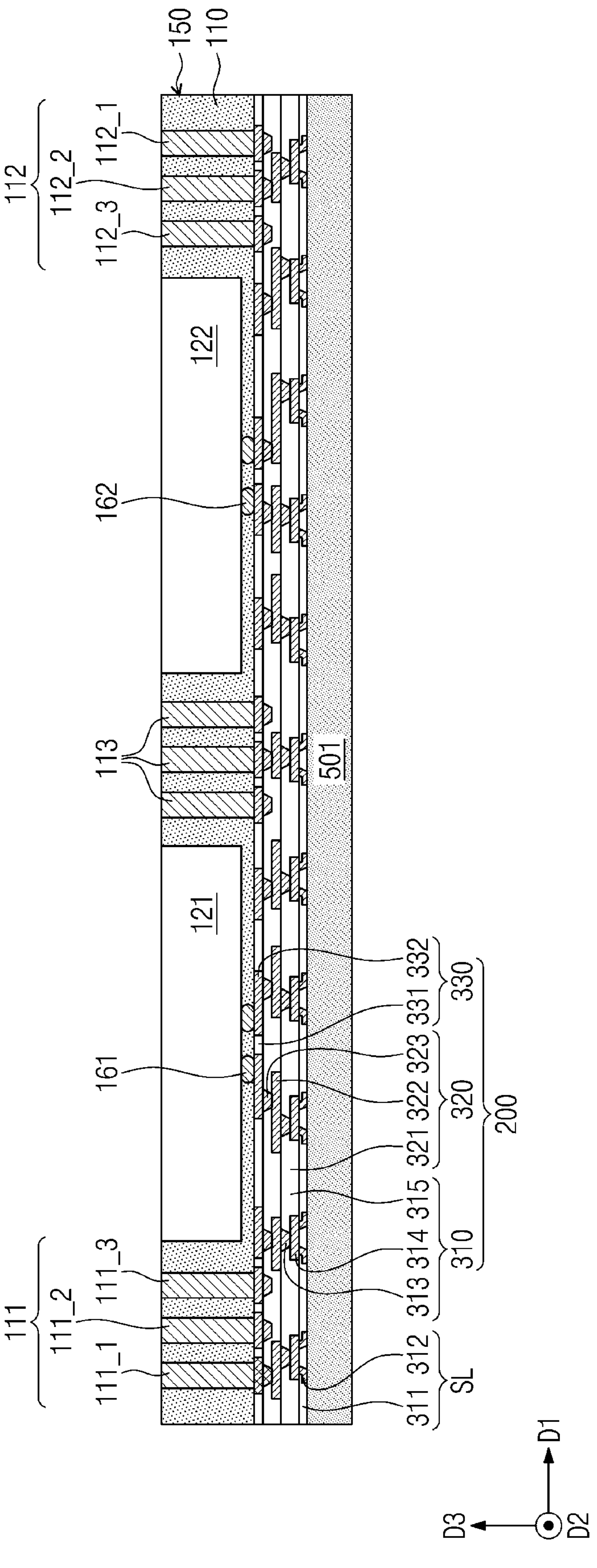

Referring to FIG. 9, the first semiconductor structure 150 may be formed on the carrier substrate 501 provided with the second redistribution layer 200.

The first semiconductor chip 121 may be mounted on the second redistribution layer 200. The first semiconductor chip 121 may be mounted on a region between the first and center connection posts 111 and 113, which will be formed in a subsequent step. The mounting of the first semiconductor chip 121 may include forming the first bumps 161 between the second redistribution layer 200 and the first semiconductor chip 121.

The second semiconductor chip 122 may be mounted on the second redistribution layer 200. The second semiconductor chip 122 may be mounted on a region between the center and second connection posts 113 and 112, which will be formed in a subsequent step. The mounting of the second semiconductor chip 122 may include forming the second bumps 162 between the second redistribution layer 200 and the second semiconductor chip 122.

The first connection posts 111, the center connection posts 113, and the second connection posts 112 may be formed on the second redistribution layer 200. The first connection posts 111, the center connection posts 113, and the second connection posts 112 may be formed by an electroplating process.

The first mold insulating layer 110 may be formed on the second redistribution layer 200 to cover side surfaces of the first connection post 111, the center connection post 113, and the second connection post 112. The first mold insulating layer 110 may cover side surfaces of the first and second semiconductor chips 121 and 122.

A grinding process may be performed on the first mold insulating layer 110 to remove a portion of the first mold insulating layer 110. As a result of the grinding process, the top surfaces of the first connection post 111, the center connection post 113, the second connection post 112, and the first and second semiconductor chips 121 and 122 may be exposed to the outside.

Figure 10:
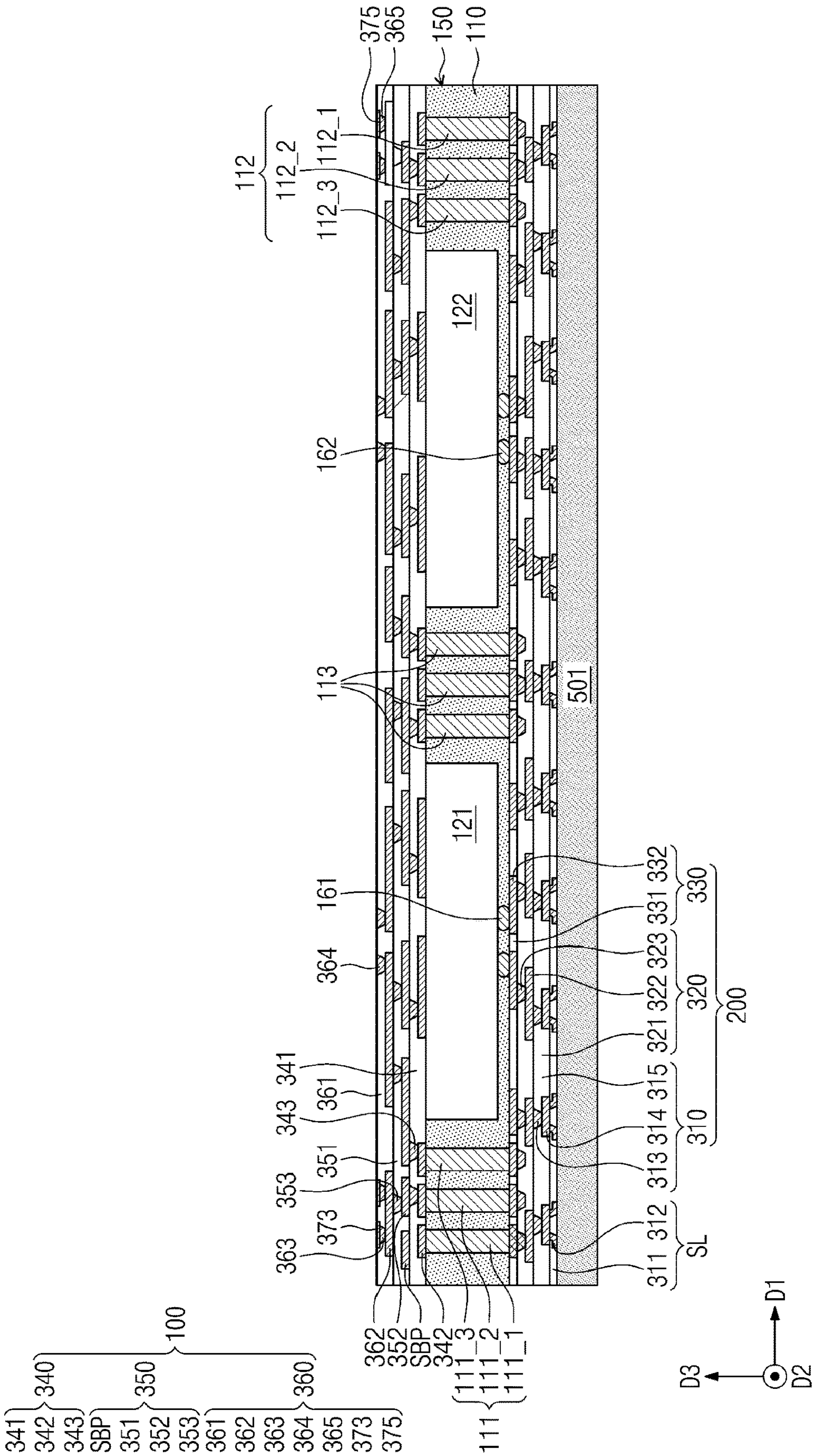

Referring to FIG. 10, the first redistribution layer 100 may be formed on the first semiconductor structure 150. The first redistribution layer 100 may be formed by sequentially forming the first lower interconnection layer 340, the first intervening interconnection layer 350, and the first upper interconnection layer 360.

The first lower interconnection layer 340 may be formed on the first semiconductor structure 150. The first lower redistribution pattern 342 and the first lower redistribution via 343 of the first lower interconnection layer 340 may be formed by an electroplating process. The first lower insulating layer 341 may be formed to cover a side surface of the first lower redistribution via 343 and side and top surfaces of the first lower redistribution pattern 342.

The first intervening interconnection layer 350 may be formed on the first lower interconnection layer 340. The stress buffer pattern SBP and the first intervening redistribution pattern 352 of the first intervening interconnection layer 350 may be formed by an electroplating process. The first intervening redistribution via 353 may be formed by an electroplating process. The first intervening insulating layer 351 may be formed to cover a side surface of the first intervening redistribution via 353 and side and top surfaces of the first intervening redistribution pattern 352.

The stress buffer pattern SBP may be formed at a position that is not overlapped with the first lower redistribution via 343. The stress buffer pattern SBP may also be formed at a position that is not overlapped with the first intervening redistribution via 353.

The first upper interconnection layer 360 may be formed on the first intervening interconnection layer 350. The first upper redistribution pattern 362 of the first upper interconnection layer 360 may be formed by an electroplating process. The first test pad 373, the second test pad 375, and the first upper redistribution via 364 of the first upper interconnection layer 360 may be formed by an electroplating process. The first test pad 373, the second test pad 375, and the first upper redistribution via 364 may be formed at the same time. The first upper insulating layer 361 may be formed to cover a side surface of the first test via 363, the first upper redistribution via 364, and the second test via 365, side and bottom surfaces of the first and second test pads 373 and 375, and side and top surfaces of the first upper redistribution pattern 362.

After the formation of the first redistribution layer 100, the first test pad 373 may be used to detect a failure of the first semiconductor chip 121. The second test pad 375 may be used to detect a failure of the second semiconductor chip 122.

Figure 11:
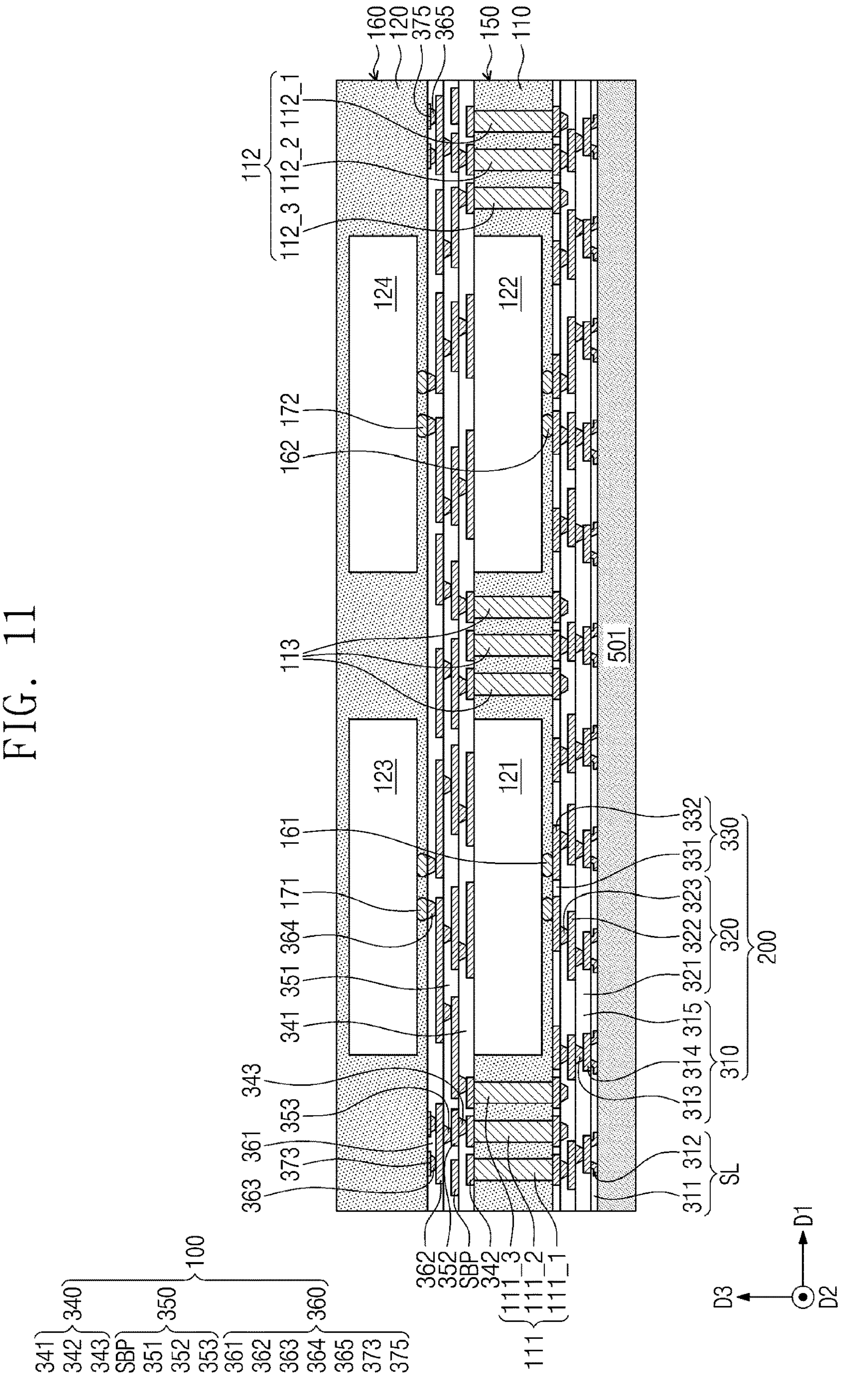

Referring to FIG. 11, if any failure is not detected from the first and second semiconductor chips 121 and 122, the third and fourth semiconductor chips 123 and 124 may be mounted on the first redistribution layer 100.

The mounting of the third semiconductor chip 123 may include forming the third bumps 171 between the first redistribution layer 100 and the third semiconductor chip 123. The mounting of the fourth semiconductor chip 124 may include forming the fourth bumps 172 between the first redistribution layer 100 and the fourth semiconductor chip 124.

The second mold insulating layer 120 may be formed on the first redistribution layer 100 to cover the side and top surfaces of the third and fourth semiconductor chips 123 and 124.

Next, the carrier substrate 501 may be removed, and then, the solder balls 151 may be formed below the solder pad 312 and the solder ball pad 314. As a result of the afore-described process, the semiconductor package 1 shown, e.g., in FIG. 1 may be fabricated.

According to an embodiment of the inventive concept, a redistribution layer may include a test pad and a stress buffer pattern, and in this case, it may be possible to relieve a physical stress exerted during probing of the test pad.

While example embodiments of the inventive concept have been particularly shown and described, it will be understood by one of ordinary skill in the art that variations in form and detail may be made therein without departing from the spirit and scope of the invention.

What is claimed is:

1. A semiconductor package comprising:
- a first redistribution layer;
- a second redistribution layer under the first redistribution layer;
- a first semiconductor chip between the first redistribution layer and the second redistribution layer; and
- a second semiconductor chip between the first redistribution layer and the second redistribution layer,
- wherein the first redistribution layer comprises a first intervening interconnection layer and a first upper interconnection layer,
- wherein the first intervening interconnection layer comprises:
- a first intervening insulating layer;
- a first intervening redistribution pattern; and
- a stress buffer pattern, which is spaced apart from the first intervening redistribution pattern and is in an electrically floated state,
- wherein the first upper interconnection layer comprises:
- a first upper insulating layer;
- a first upper redistribution pattern; and
- a first test pad on the first upper redistribution pattern, and
- wherein an area of the stress buffer pattern is larger than an area of the first test pad.

2. The semiconductor package of claim 1, further comprising a first connection post electrically connected to the first test pad.

3. The semiconductor package of claim 1, further comprising:
- a third semiconductor chip on the first redistribution layer;
- a fourth semiconductor chip on the first redistribution layer and spaced apart from the third semiconductor chip; and
- a second connection post spaced apart from the second semiconductor chip, wherein the second connection post connects the first redistribution layer to the second redistribution layer,
- wherein the first upper interconnection layer further comprises a second test pad,
- wherein the first semiconductor chip and the second semiconductor chip are between the first test pad and the second test pad, and
- wherein the second connection post is electrically connected to the second test pad.

4. The semiconductor package of claim 1, wherein the stress buffer pattern has a circular shape,
- wherein a diameter of the stress buffer pattern is larger than or equal to 200 μm, and
- wherein the stress buffer pattern overlaps the first test pad when viewed in a plan view.

5. The semiconductor package of claim 1, wherein the first test pad has a tetragonal shape, and
- wherein a length of the longest side of the first test pad is less than or equal to 100 μm.

6. The semiconductor package of claim 1, wherein a thickness of the first redistribution layer is between 10 μm and 60 μm.

7. The semiconductor package of claim 1, wherein a Young's modulus of the first intervening insulating layer is less than a Young's modulus of the first upper insulating layer.

8. The semiconductor package of claim 1, wherein the stress buffer pattern has a dumbbell shape.

9. The semiconductor package of claim 1, further comprising a mold insulating layer on the first redistribution layer,
- wherein a top surface of the first test pad and a top surface of a second test pad are covered with the mold insulating layer.

10. The semiconductor package of claim 1, wherein a Young's modulus of the first intervening insulating layer is less than or equal to 3.0 GPa.

11. A semiconductor package comprising:
- a first semiconductor chip;

a second semiconductor chip spaced apart from the first semiconductor chip;

a center connection post between the first semiconductor chip and the second semiconductor chip;

a first connection post;

a second connection post; and a first redistribution layer on the first semiconductor chip and the second semiconductor chip, wherein the first redistribution layer comprises a first intervening interconnection layer and a first upper interconnection layer on the first intervening interconnection layer, wherein the first intervening interconnection layer comprises:

a first intervening redistribution pattern; and a stress buffer pattern, which is spaced apart from the first intervening redistribution pattern and is in an electrically floated state, wherein the first upper interconnection layer comprises:

a first upper redistribution pattern;

a first test pad overlapped with the first connection post when viewed in a plan view; and a second test pad overlapped with the second connection post when viewed in the plan view, wherein the first connection post comprises a first inner connection post, a first center connection post, and a first outer connection post, wherein the first inner connection post, the first center connection post, and the first outer connection post are separate from each other, wherein the first outer connection post is electrically connected to the first test pad, wherein the second connection post comprises a second inner connection post, a second center connection post, and a second outer connection post, wherein the second outer connection post is electrically connected to the second test pad, and wherein a horizontal width of the stress buffer pattern is larger than the largest horizontal width of the first test pad.

12. The semiconductor package of claim 11, wherein the first redistribution layer comprises a first lower interconnection layer below the first intervening interconnection layer, wherein the first lower interconnection layer comprises a first lower insulating layer, wherein a Young's modulus of the first lower insulating layer is between 3.0 GPa and 5.0 GPa, and wherein a Young's modulus of the first intervening insulating layer is less than or equal to 3.0 Gpa.

13. The semiconductor package of claim 11, further comprising a mold insulating layer on the first redistribution layer, wherein the entire top surface of the first test pad is in contact with the mold insulating layer.

14. The semiconductor package of claim 11, wherein the stress buffer pattern comprises a stress buffer layer with buffer via holes.

15. The semiconductor package of claim 11, wherein the stress buffer pattern comprises circular pattern portions, wherein each of the circular pattern portions has a size that is different from each other circular pattern portion, and wherein the stress buffer pattern further comprises connecting portions which connect the circular pattern portions to each other.

16. The semiconductor package of claim 11, wherein the stress buffer pattern has a circular shape, wherein the first test pad has a tetragonal shape, wherein a diameter of the stress buffer pattern is larger than or equal to 200 μm, and wherein a length of a side of the first test pad is less than or equal to 100 μm.

17. The semiconductor package of claim 11, wherein the first redistribution layer further comprises a first lower interconnection layer below the first intervening interconnection layer, wherein the first lower interconnection layer comprises a first lower insulating layer, wherein the stress buffer pattern and the first test pad are overlapped with each other when viewed in a plan view, and wherein an entire bottom surface of the stress buffer pattern contacts the first lower insulating layer.

18. A semiconductor package comprising:

a first redistribution layer;

a second redistribution layer under the first redistribution layer;

a first semiconductor chip between the first redistribution layer and the second redistribution layer;

a second semiconductor chip between the first redistribution layer and the second redistribution layer;

a first connection post spaced apart from the first semiconductor chip, wherein the first connection post connects the first redistribution layer to the second redistribution layer, and a center connection post between the first semiconductor chip and the second semiconductor chip, wherein the first redistribution layer comprises a first intervening interconnection layer and a first upper interconnection layer, wherein the first intervening interconnection layer comprises:

a first intervening insulating layer;

a first intervening redistribution pattern; and a stress buffer pattern, which is spaced apart from the first intervening redistribution pattern and is in an electrically floated state, wherein the first upper interconnection layer comprises:

a first upper insulating layer;

a first upper redistribution pattern; and a first test pad on the first upper redistribution pattern, and wherein an area of the stress buffer pattern is larger than an area of the first test pad, and wherein a Young's modulus of the first intervening insulating layer is less than a Young's modulus of the first upper insulating layer.

19. The semiconductor package of claim 18, wherein the first test pad is overlapped with the first connection post when viewed in a plan view, and wherein the first test pad is overlapped with the stress buffer pattern when viewed in a plan view.

* * * * *